US012649866B2

(12) United States Patent
    Abe

(10) Patent No.: US 12,649,866 B2
(45) Date of Patent: *Jun. 9, 2026

(54) POLISHING COMPOSITION, POLISHING METHOD, AND METHOD FOR MANUFACTURING SEMICONDUCTOR SUBSTRATE

(71) Applicant: FUJIMI INCORPORATED, Kiyosu (JP)

(72) Inventor: Masashi Abe, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/890,938

(22) Filed: Sep. 20, 2024

(65) Prior Publication Data

US 2025/0109319 A1     Apr. 3, 2025

(30) Foreign Application Priority Data

Sep. 29, 2023    (JP) ................................. 2023-169675

(51) Int. Cl.

| | |
|---|---|
| *C09G 1/02* | (2006.01) |
| *B24B 37/04* | (2012.01) |
| *C09K 3/14* | (2006.01) |
| *H10P 52/00* | (2026.01) |
| *H10P 52/40* | (2026.01) |

(52) U.S. Cl.
CPC .............. *C09G 1/02* (2013.01); *B24B 37/044* (2013.01); *C09K 3/1409* (2013.01); *H10P 52/403* (2026.01)

(58) Field of Classification Search
None
See application file for complete search history.

(56) References Cited

U.S. PATENT DOCUMENTS

| | | | |
|---|---|---|---|
| 6,309,560 B1 | 10/2001 | Kaufman et al. | |
| 2004/0154931 A1* | 8/2004 | Hongo ..................... | B23H 5/12 205/676 |
| 2017/0247574 A1* | 8/2017 | Takahashi ............ | C09K 3/1436 |
| 2020/0071568 A1* | 3/2020 | Kadohashi .......... | H01L 21/3212 |
| 2020/0303198 A1* | 9/2020 | Kadohashi .......... | H01L 21/3212 |
| 2021/0324236 A1* | 10/2021 | Guo ................... | H01L 21/76819 |
| 2022/0055180 A1* | 2/2022 | Chang ...................... | C09K 3/14 |
| 2022/0298380 A1* | 9/2022 | Yoshizaki ........... | H01L 21/3212 |
| 2024/0124744 A1* | 4/2024 | Kim ........................ | C09K 15/20 |
| 2024/0182751 A1* | 6/2024 | Abe ......................... | C09G 1/02 |

FOREIGN PATENT DOCUMENTS

| | | |
|---|---|---|
| JP | H11-021546 A | 1/1999 |
| JP | 2005-162533 A | 6/2005 |

* cited by examiner

*Primary Examiner* — Shamim Ahmed
(74) *Attorney, Agent, or Firm* — Foley & Lardner LLP

(57) ABSTRACT

There is provided a polishing composition capable of improving a polishing removal rate of a certain film type and suppressing a polishing removal rate of another certain film type, that is, capable of controlling a so-called polishing selection ratio, in an object to be polished containing two or more different film types. The present invention relates to a polishing composition containing abrasive grains, an acid, a polishing inhibitor, and an oxidizing agent, in which the abrasive grains have a positive zeta potential, the acid is an organic acid, the polishing inhibitor contains a nonionic surfactant, the oxidizing agent is hydrogen peroxide, and a pH of the polishing composition is 2 or more and 4 or less.

15 Claims, No Drawings

POLISHING COMPOSITION, POLISHING METHOD, AND METHOD FOR MANUFACTURING SEMICONDUCTOR SUBSTRATE

CROSS-REFERENCE TO RELATED APPLICATION

The present application is based on Japanese Patent Application No. 2023-169675 filed on Sep. 29, 2023, the disclosure content of which is incorporated herein by reference in its entirety.

BACKGROUND

1. Technical Field

The present invention relates to a polishing composition, a polishing method, and a method for manufacturing a semiconductor substrate.

2. Description of Related Arts

In recent years, in accordance with multilayer wiring on a surface of a semiconductor substrate, when manufacturing a device, semiconductor substrates are polished and planarized, that is, so-called chemical mechanical polishing (CMP) technology is utilized. CMP is a method of planarizing a surface of an object to be polished such as a semiconductor substrate using a polishing composition (slurry) containing abrasive grains such as silica, alumina, and ceria, an anticorrosive, a surfactant, and the like, and the object to be polished is a film containing silicon, polysilicon, silicon oxide, silicon nitride, titanium nitride, titanium, tantalum nitride, or the like, wiring made of, for example, a metal such as copper or tungsten, a plug, or the like.

In particular, focusing on polishing of titanium nitride, Japanese Patent Application Laid-Open No. 11-021546 (corresponding to U.S. Pat. No. 6,309,560) discloses that a titanium film or a titanium nitride film can be polished by a polishing composition containing a polishing material, at least one complex generating agent selected from the group consisting of hydrogen peroxide, citric acid, lactic acid, tartaric acid, succinic acid, acetic acid, oxalic acid, and salts thereof, and a film generating agent such as benzotriazole (BTA).

SUMMARY

Recently, in an object to be polished containing two or more different film types, there is a demand for improving a polishing removal rate of a certain film type and suppressing a polishing removal rate of another certain film type, that is, controlling a so-called polishing selection ratio.

Therefore, an object of the present invention is to provide a polishing composition capable of improving a polishing removal rate of a certain film type and suppressing a polishing removal rate of another certain film type, that is, capable of controlling a so-called polishing selection ratio, in an object to be polished containing two or more different film types.

In order to solve the above problems, the present inventors have intensively studied. As a result, the present inventors have found that the above problems are solved by a polishing composition containing abrasive grains, an acid, a polishing inhibitor, and an oxidizing agent, in which the abrasive grains have a positive zeta potential, the acid is an organic acid, the polishing inhibitor contains a nonionic surfactant, the oxidizing agent is hydrogen peroxide, and a pH of the polishing composition is 2 or more and 4 or less, and have completed the present invention.

DETAILED DESCRIPTION

Hereinafter, embodiments of the present invention will be described, but the present invention is not limited only to the following embodiments, and various modifications can be made within the scope of claims. Therefore, other embodiments, usage methods, operation techniques, and the like that can be implemented by those skilled in the art and the like without departing from the gist of the present invention are all included in the scope and gist of the present invention and included in the invention described in the claims and the scope of equivalents thereof. The embodiments described in the present specification may be other embodiments by being combined in any manner. In addition, in the present specification, "X to Y" indicating a range means "X or more and Y or less", and "weight" and "mass", "weight %" and "mass %", and "parts by weight" and "parts by mass" are treated as synonyms. In the present specification, unless otherwise specified, operations and measurements of physical properties and the like are performed under conditions of room temperature (20° C. or more and 25° C. or less)/relative humidity of 40% RH or more and 50% RH or less.

According to an embodiment of the present invention, there is provided a polishing composition containing abrasive grains, an acid, a polishing inhibitor, and an oxidizing agent, in which the abrasive grains have a positive zeta potential, the acid is an organic acid, the polishing inhibitor contains a nonionic surfactant, the oxidizing agent is hydrogen peroxide, and a pH of the polishing composition is 2 or more and 4 or less. According to the polishing composition having such a configuration, in the object to be polished containing two or more different film types, the polishing removal rate of a certain film type can be improved, and the polishing removal rate of another certain film type can be suppressed. That is, according to the polishing composition having such a configuration, the polishing selection ratio can be controlled in the object to be polished containing two or more different film types. According to one embodiment, the inventor estimates a mechanism by which such an effect can be obtained by the present invention as follows. However, the following mechanism is an estimation mechanism taking as an example a case where an object to be polished including a titanium nitride film and a silicon oxide film is used, and the scope of the present invention is not limited by this.

An object of an embodiment of the present invention is to improve the polishing removal rate of a titanium nitride film and to suppress the polishing removal rate of a silicon oxide film. Hydrogen peroxide as an oxidizing agent is used to improve the polishing removal rate, but when the polishing removal rate of the silicon oxide film is improved, the polishing selection ratio (hereinafter also simply referred to as a "polishing selection ratio of titanium nitride/silicon oxide") represented by the polishing removal rate of the titanium nitride film/the polishing removal rate of the silicon oxide film decreases. In addition, it has also been found that when the pH of the polishing composition is less than 2 or more than 4, the polishing removal rate of the silicon oxide film is improved, and the polishing selection ratio of titanium nitride/silicon oxide is reduced. Therefore, a compound that does not affect the titanium nitride film and suppresses the polishing removal rate with respect to the silicon oxide film was intensively studied. As a result, the present inventors have found a compound that selectively adsorbs to a silicon oxide film and inhibits contact with abrasive grains by containing hydrogen peroxide as an oxidizing agent in combination with an organic acid. That is, the present inventor has found that a nonionic surfactant can serve as a polishing inhibitor for a silicon oxide film under specific conditions. The reason why the nonionic surfactant does not affect the titanium nitride film and is selectively adsorbed to the silicon oxide film is not clear, but it is considered that the polarity indicated by the nonionic surfactant is similar to the polarity indicated by the repeating unit of silicon oxide, and the affinity is high. In the polishing composition of the present invention, the nonionic surfactant is selectively adsorbed to the surface of the silicon oxide film under specific conditions to form a film that protects the surface of the silicon oxide film. As a result, it is considered that the contact between the silicon oxide film and the abrasive grains is suppressed, and the polishing removal rate of the silicon oxide film is suppressed, and thus the polishing selection ratio of titanium nitride/silicon oxide can be increased. As described above, the present inventors have found that the problem of providing a polishing composition having a high polishing selection ratio of titanium nitride/silicon oxide may be solved by a polishing composition containing abrasive grains, an organic acid, a nonionic surfactant as a polishing inhibitor, and hydrogen peroxide as an oxidizing agent and having a pH of 2 or more and 4 or less.

Therefore, in an embodiment of the present invention, the titanium nitride film can be polished at a high polishing removal rate with respect to the polishing removal rate of the silicon oxide film by the polishing composition according to the present aspect (that is, the polishing selection ratio represented by the polishing removal rate of the titanium nitride film/the polishing removal rate of the silicon oxide film is high.). Therefore, according to the polishing composition according to the present aspect, the polishing selection ratio of titanium nitride/silicon oxide can be improved.

As described above, according to an embodiment of the present invention, there is provided a polishing composition capable of improving a polishing removal rate of a certain film type and suppressing a polishing removal rate of another certain film type, that is, capable of controlling a so-called polishing selection ratio, in an object to be polished containing two or more different film types.

[Object to be Polished]

Examples of the material contained in the object to be polished which is polished by the polishing composition according to the present aspect include silicon oxide ($SiO_2$), silicon nitride (SiN), silicon carbonitride (SiCN), polycrystalline silicon (polysilicon), amorphous silicon, metal, SiGe, a Group 13 element, and the like. The object to be polished according to the present aspect is preferably an object to be polished containing two or more different film types.

Examples of the film containing silicon oxide include a TEOS (tetraethyl orthosilicate) type silicon oxide film (hereinafter also simply referred to as "TEOS film") generated using tetraethyl orthosilicate as a precursor, a HDP (high density plasma) film, a USG (undoped silicate glass) film, a PSG (phosphorus silicate glass) film, a BPSG (boron-phospho silicate glass) film, an RTO (rapid thermal oxidation) film, and the like.

Examples of the film containing metal include a tungsten (W) film, a titanium nitride (TiN) film, a ruthenium (Ru) film, a platinum (Pt) film, a gold (Au) film, a hafnium (Hf) film, a cobalt (Co) film, a nickel (Ni) film, a copper (Cu)

film, an aluminum (Al) film, a tantalum (Ta) film, and the like. From the viewpoint of improving the conductivity, a W film, a TiN film, a Ru film, a Pt film, or an Au film is preferably used, a W film or a TiN film is particularly preferably used, and a W film is most preferably used. In one embodiment, the polishing composition of the present invention can also suitably polish an object to be polished containing a metal (for example, tungsten).

The object to be polished according to the present aspect may have a layer (hereinafter also simply referred to as a Group 13 element layer) containing 40 mass % or more of a Group 13 element. Examples of the Group 13 element include boron (B), aluminum (Al), gallium (Ga), and indium (In). The Group 13 elements may be used alone or in combination of two or more types thereof.

The Group 13 element layer may contain an element other than the Group 13 element. Examples of other elements include silicon (Si), hydrogen (H), nitrogen (N), oxygen (O), carbon (C), phosphorus (P), germanium (Ge), and the like. These other elements may be contained alone or in combination of two or more types thereof.

The lower limit of the amount of the Group 13 element contained in the Group 13 element layer is 40 mass % or more, preferably 45 mass % or more, and more preferably 50 mass % or more, with respect to the mass of the entire layer. In addition, the upper limit of the amount of the Group 13 element contained in the Group 13 element layer is 100 mass % or less, preferably 95 mass % or less, and more preferably 90 mass % or less, with respect to the mass of the entire layer.

According to the present aspect, the polishing composition can improve a polishing removal rate of a certain film type and suppress a polishing removal rate of another certain film type, that is, control a so-called polishing selection ratio, in an object to be polished containing two or more different film types. The object to be polished according to the present aspect preferably includes a silicon oxide film or a titanium nitride film. Therefore, the polishing composition of an embodiment of the present invention is preferably used for polishing an object to be polished including a silicon oxide film or a silicon nitride film.

In one embodiment, the object to be polished according to the present aspect preferably contains a Group 13 element. Therefore, the polishing composition of the present invention is preferably used for polishing an object to be polished containing a Group 13 element.

Furthermore, the shape of the object to be polished is not particularly limited. In an embodiment of the present invention, the polishing composition can be preferably applied to, for example, polishing an object to be polished having a flat surface such as a plate shape or a polyhedral shape.

[Abrasive Grains]

The polishing composition according to the present aspect contains abrasive grains. The abrasive grains contained in the polishing composition according to the present aspect have a positive zeta potential. The abrasive grains are preferably cationically modified silica (silica having a cationic group), and more preferably cationically modified colloidal silica (colloidal silica having a cationic group). The abrasive grains may be used alone or in combination of two or more types thereof. As the abrasive grains, a commercially available product may be used, or a synthetic product may be used.

Examples of the method for manufacturing colloidal silica include a sodium silicate method and a sol-gel method, and any colloidal silica manufactured by any production method is suitably used as the abrasive grains according to the present aspect. However, from the viewpoint of reducing metal impurities, colloidal silica manufactured by a sol-gel method is preferable. Colloidal silica manufactured by a sol-gel method is preferable because it has a small content of metal impurities having diffusibility in a semiconductor and corrosive ions such as chloride ions. The manufacturing of colloidal silica by the sol-gel method can be performed using a conventionally known method, and specifically, colloidal silica can be obtained by performing a hydrolysis/condensation reaction using a hydrolyzable silicon compound (for example, an alkoxysilane or a derivative thereof) as a raw material.

Here, the cationic modification means a state where a cationic group (for example, an amino group or a quaternary ammonium group) is bonded to the surface of silica (preferably colloidal silica). According to a preferred embodiment of the present invention, the cationically modified silica particles are amino group-modified silica particles, and more preferably amino group-modified colloidal silica particles. According to this embodiment, the above effect can be further improved.

In order to cationically modify silica (colloidal silica), a silane coupling agent having a cationic group (for example, an amino group or a quaternary ammonium group) may be added to silica (colloidal silica), and the mixture may be reacted at a predetermined temperature for a predetermined time. In a preferred embodiment of the present invention, the cationically modified silica is formed by immobilizing a silane coupling agent having an amino group or a silane coupling agent having a quaternary ammonium group on the surface of silica (more preferably colloidal silica).

Examples of the silane coupling agent used at this time include those described in Japanese Patent Application Laid-Open No. 2005-162533. Specific examples thereof include silane coupling agents such as N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltriethoxysilane((3-aminopropyl)triethoxysilane), γ-aminopropyltrimethoxysilane, γ-triethoxysilyl-N-(α,γ-dimethyl-butylidene)propylamine, N-phenyl-γ-aminopropyltrimethoxysilane, hydrochloride of N-(vinylbenzyl)-β-aminoethyl-γ-aminopropyltriethoxysilane, octadecyldimethyl-(γ-trimethoxysilylpropyl)-ammonium chloride, and N-trimethoxysilylpropyl-N,N,N-trimethylammonium chloride. Among these, N-(β-aminoethyl)-γ-aminopropyltrimethoxysilane, N-(β-aminoethyl)-γ-aminopropyltriethoxysilane, γ-aminopropyltriethoxysilane, and γ-aminopropyltrimethoxysilane are preferably used because they have good reactivity with colloidal silica. In an embodiment of the present invention, only one silane coupling agent may be used alone, or two or more silane coupling agents may be used in combination.

The silane coupling agent can be added to silica (colloidal silica) as it is or after being diluted with a hydrophilic organic solvent or pure water. By diluting with a hydrophilic organic solvent or pure water, the generation of aggregates can be suppressed. When the silane coupling agent is diluted with a hydrophilic organic solvent or pure water, the silane coupling agent may be diluted with the hydrophilic organic solvent or pure water such that the silane coupling agent has a concentration of preferably about 0.01 g or more and 1 g or less, more preferably about 0.1 g or more and 0.7 g or less in 1 L of the hydrophilic organic solvent or pure water. Examples of the hydrophilic organic solvent include, but are not particularly limited to, for example, lower alcohols such as methanol, ethanol, isopropanol, and butanol.

In addition, the amount of the cationic group introduced to the surface of silica (colloidal silica) can be adjusted by adjusting the addition amount of the silane coupling agent. The amount of the silane coupling agent used is not particularly limited, but is preferably about 0.1 mM (mmol/L) or more and 5 mM or less, and more preferably about 0.5 mM or more and 3 mM or less with respect to the reaction liquid.

The treatment temperature at the time of cationically modifying silica (colloidal silica) with the silane coupling agent is not particularly limited, and may be a temperature from room temperature (for example, 25° C.) to about the boiling point of the dispersing medium for dispersing silica (colloidal silica), and is specifically about 0° C. or more and 100° C. or less, preferably about room temperature (for example, 25° C.) or more and 90° C. or less.

The lower limit of the zeta potential of the abrasive grains in the polishing composition is preferably 5 mV or more, more preferably 10 mV or more, still more preferably 15 mV or more, particularly preferably 18 mV or more, and most preferably 20 mV or more. In addition, the upper limit of the zeta potential of the abrasive grains in the polishing composition is preferably 70 mV or less, more preferably 60 mV or less, still more preferably 50 mV or less, particularly preferably 40 mV or less, and most preferably 35 mV or less. That is, the zeta potential of the abrasive grains in the polishing composition is preferably 5 mV or more and 70 mV or less, more preferably 10 mV or more and 60 mV or less, still more preferably 15 mV or more and 50 mV or less, particularly preferably 18 mV or more and 40 mV or less, and most preferably 20 mV or more and 35 mV or less.

With the abrasive grains having the zeta potential as described above, in the object to be polished containing two or more different film types, the polishing removal rate of a certain film type can be improved, and the polishing removal rate of another certain film type can be suppressed. According to one embodiment, with the abrasive grains having the zeta potential as described above, the titanium nitride film can be polished at a higher polishing removal rate, and the polishing removal rate of the titanium nitride film is higher than the polishing removal rate of the silicon oxide film (the polishing selection ratio is higher).

The shape of the abrasive grains is not particularly limited, and may be spherical or non-spherical. Specific examples of the non-spherical shape include various shapes such as a polygonal columnar shape such as a triangular prism and a quadrangular prism, a columnar shape, a barrel shaped having the central portion of the cylinder bulging more than the end portions, a donut shape in which a central portion of a disk penetrates, a plate shape, a so-called cocoon shape having a constriction at the central portion, a so-called associated spherical shape in which a plurality of particles are integrated, a so-called konpeito shape having a plurality of particles, and a rugby ball shape, and are not particularly limited.

The average primary particle size of the abrasive grains is preferably 1 nm or more, more preferably 3 nm or more, and still more preferably 5 nm or more. When the average primary particle size of the abrasive grains is such a lower limit, in the object to be polished containing two or more different film types, the polishing removal rate of a certain film type can be improved, and the polishing removal rate of another certain film type can be suppressed. According to one embodiment, the polishing removal rate of the titanium nitride film is improved as the average primary particle size of the abrasive grains increases. In addition, the average primary particle size of the abrasive grains is preferably 100 nm or less, more preferably 50 nm or less, and still more preferably 30 nm or less. When the average primary particle size of the abrasive grains is such an upper limit, in the object to be polished containing two or more different film types, the polishing removal rate of a certain film type can be improved, and the polishing removal rate of another certain film type can be suppressed. According to one embodiment, as the average primary particle size of the abrasive grains decreases, the polishing removal rate of the titanium nitride film becomes higher (the polishing selection ratio becomes higher) as compared to the polishing removal rate of the silicon oxide film.

That is, the average primary particle size of the abrasive grains is preferably 1 nm or more and 100 nm or less, more preferably 3 nm or more and 50 nm or less, and still more preferably 5 nm or more and 30 nm or less. The average primary particle size of the abrasive grains can be calculated based on, for example, the specific surface area (SA) of the abrasive grains calculated from the BET method and the density of the abrasive grains. More specifically, as the average primary particle size of the abrasive grains, a value measured by the method described in Examples is adopted.

The average secondary particle size of the abrasive grains is preferably 15 nm or more, more preferably 20 nm or more, and still more preferably 25 nm or more. When the average secondary particle size of the abrasive grains is such a lower limit, the polishing removal rate of a certain film type can be improved, and the polishing removal rate of another certain film type can be suppressed. According to one embodiment, as the average secondary particle size of the abrasive grains increases, the resistance during polishing decreases, and stable polishing of the titanium nitride film becomes possible. In addition, the average secondary particle size of the abrasive grains is preferably 200 nm or less, more preferably 150 nm or less, and still more preferably 100 nm or less. When the average secondary particle size of the abrasive grains is such an upper limit, the polishing removal rate of a certain film type can be improved, and the polishing removal rate of another certain film type can be suppressed. According to one embodiment, as the average secondary particle size of the abrasive grains decreases, the surface area per unit mass of the abrasive grains increases, the contact frequency with the object to be polished is improved, and the polishing speed of the titanium nitride film is further improved. That is, the average secondary particle size of the abrasive grains is preferably 15 nm or more and 200 nm or less, more preferably 20 nm or more and 150 nm or less, and still more preferably 25 nm or more and 100 nm or less. The average secondary particle size of the abrasive grains can be measured by, for example, a dynamic light scattering method represented by a laser diffraction scattering method, and specifically, a value measured by the method described in Examples is adopted.

The ratio of the average secondary particle size to the average primary particle size of the abrasive grains (average secondary particle size/average primary particle size, hereinafter also referred to as "average association degree") is preferably more than 1.0, more preferably 1.1 or more, and still more preferably 1.2 or more. When the average association degree of the abrasive grains is such a lower limit, the polishing removal rate of a certain film type can be improved, and the polishing removal rate of another certain film type can be suppressed. According to one embodiment, the polishing removal rate of the titanium nitride film is further improved as the average association degree of the abrasive grains increases. In addition, the average association degree of the abrasive grains is preferably 4 or less, more preferably 3.5 or less, and still more preferably 3 or less. When the average association degree of the abrasive grains is the upper limit, the polishing removal rate of a certain film type can be improved, and the polishing removal rate of another certain film type can be suppressed. According to one embodiment, as the average association degree of the abrasive grains decreases, the polishing removal rate of the titanium nitride film becomes higher (the polishing selection ratio becomes higher) as compared to the polishing removal rate of the silicon oxide film. That is, the average association degree of the abrasive grains is preferably more than 1.0 and 4 or less, more preferably 1.1 or more and 3.5 or less, and still more preferably 1.2 or more and 3 or less.

The abrasive grain average association degree is obtained by dividing the value of the average secondary particle size of the abrasive grains by the value of the average primary particle size.

The upper limit of the aspect ratio of the abrasive grains in the polishing composition is not particularly limited, but is preferably less than 2.0, more preferably 1.8 or less, and still more preferably 1.5 or less. Within such a range, defects on the surface of the object to be polished can be further reduced. The aspect ratio is an average of values obtained by taking the smallest rectangle circumscribing the image of the abrasive grains by the scanning electron microscope and dividing the length of the long side of the rectangle by the length of the short side of the same rectangle, and can be obtained using general image analysis software. The lower limit of the aspect ratio of the abrasive grains in the polishing composition is not particularly limited, but is preferably 1.0 or more.

The size (average primary particle size, average secondary particle size, aspect ratio, and the like) of the abrasive grains can be appropriately controlled by selecting a method for manufacturing the abrasive grains, for example.

In the present specification, a value measured by the method described in Examples is adopted as the zeta potential of the abrasive grains. The zeta potential of the abrasive grains can be adjusted by the amount of the cationic group of the abrasive grains, the pH of the polishing composition, and the like.

In the polishing composition according to the present aspect, the abrasive grains may be used alone or in combination of two or more types thereof. As the abrasive grains, a commercially available product or a synthetic product may be used.

The content (concentration) of the abrasive grains in the polishing composition is not particularly limited, but is preferably 0.1 mass % or more, more preferably 0.2 mass % or more, still more preferably 0.5 mass % or more, and particularly preferably more than 0.5 mass % with respect to the total mass of the polishing composition. In addition, the upper limit of the content of the abrasive grains in the polishing composition is preferably 10 mass % or less, more preferably 5 mass % or less, still more preferably 4 mass % or less, and particularly preferably less than 4 mass % with respect to the total mass of the polishing composition. That is, the content of the abrasive grains is preferably 0.1 mass % or more and 10 mass % or less, more preferably 0.2 mass % or more and 5 mass % or less, still more preferably 0.5 mass % or more and 4 mass % or less, and particularly preferably more than 0.5 mass % and less than 4 mass % with respect to the total mass of the polishing composition. In one embodiment, the content (concentration) of the abrasive grains in the polishing composition is 0.01 mass % or more and 3.0 mass % or less.

When the content of the abrasive grains is in such a range, the polishing removal rate of a certain film type can be improved, and the polishing removal rate of another certain film type can be suppressed. According to one embodiment, when the content of the abrasive grains is in such a range, the titanium nitride film can be polished at a higher polishing removal rate, and the polishing removal rate of the titanium nitride film is higher than the polishing removal rate of the silicon oxide film (the polishing selection ratio is higher). When the polishing composition contains two or more types of abrasive grains, the content of the abrasive grains is intended to be the total amount thereof.

When cationically modified silica is used as the abrasive grains in the polishing composition according to the present aspect, other abrasive grains other than cationically modified silica may be further included as long as the effect of the present invention is not impaired. Such other abrasive grains may be any of inorganic particles, organic particles, and organic-inorganic composite particles. Specific examples of the inorganic particles include particles made of metal oxides such as unmodified silica, alumina, ceria, and titania, silicon nitride particles, silicon carbide particles, and boron nitride particles. Specific examples of the organic particles include polymethyl methacrylate (PMMA) particles.

[Polishing Inhibitor]

The polishing composition according to the present aspect contains a nonionic surfactant as a polishing inhibitor. The nonionic surfactant has a function of suppressing a polishing removal rate of another certain film type (for example, a silicon oxide film). In one embodiment, the nonionic surfactant serves to reduce the polishing removal rate of the silicon oxide film. Thus, according to one embodiment, the polishing inhibitor is a silicon oxide polishing inhibitor. The nonionic surfactant may be used alone or in combination of two or more types thereof. As the nonionic surfactant, a commercially available product or a synthetic product may be used.

Examples of the nonionic surfactant used in the polishing composition according to the present aspect include alkyl betaines, alkylamine oxides, polyoxyalkylene glycols, polyoxyalkylene alkyl ethers, sorbitan fatty acid esters, glycerin fatty acid esters, polyoxyalkylene fatty acid esters, polyoxyalkylene alkylamines, alkylalkanolamides, and the like. Among these, from the viewpoint of controlling the polishing selection ratio in the object to be polished containing two or more different film types (for example, from the viewpoint of improving the polishing selection ratio of titanium nitride/silicon oxide), a compound having a polyoxyalkylene glycol structure such as a polyoxyalkylene glycol or a polyoxyalkylene alkyl ether (hereinafter also referred to as "polyoxyalkylene glycol-based compound") is preferable.

In a preferred embodiment, the polishing composition according to the present aspect contains a compound having a polyoxyalkylene glycol structure as a nonionic surfactant. In a more preferred embodiment, the polishing composition according to the present aspect contains, as the nonionic surfactant, a compound having one or more structures selected from the group consisting of a polyethylene glycol structure and a polypropylene glycol structure. In a further preferred embodiment, the polishing composition according to the present aspect contains, as the nonionic surfactant, a compound having one or more structures selected from the group consisting of a polypropylene glycol structure. By using the polyoxyalkylene glycol-based compound as the nonionic surfactant, the function of suppressing the polishing removal rate of the silicon oxide film is further exerted. The polyoxyalkylene glycol-based compounds may be used alone or in combination of two or more types thereof. As the polyoxyalkylene glycol-based compound, a commercially available product may be used, or a synthetic product may be used.

Examples of the polyoxyalkylene glycol-based compound include an oxyalkylene homopolymer, an oxyalkylene copolymer, a polyoxyalkylene alkyl ether, and the like. Therefore, in one embodiment, the polishing composition according to the present aspect contains one or more selected from the group consisting of polyethylene glycol, polypropylene glycol, polyethylene alkyl ether, and polypropylene ether.

The oxyalkylene homopolymer and the oxyalkylene copolymer are not particularly limited, and examples thereof include polyethylene glycol, polypropylene glycol, a polyethylene glycol-polypropylene glycol random copolymer, a polyethylene glycol-polytetramethylene glycol random copolymer, a polypropylene glycol-polytetramethylene glycol random copolymer, a polyethylene glycol-polypropylene glycol-polytetramethylene glycol random copolymer, a polyethylene glycol-polypropylene glycol block copolymer, a polypropylene glycol-polyethylene glycol-polypropylene glycol triblock copolymer, a polyethylene glycol-polypropylene glycol-polyethylene glycol triblock copolymer, and the like. Among these, polyethylene glycol and polypropylene glycol are preferable, and polypropylene glycol is more preferable.

Examples of the polyoxyalkylene alkyl ether include polyoxyethylene monodecyl ether, polyoxyethylene monoundecyl ether, polyoxyethylene monododecyl ether (polyoxyethylene monolauryl ether), polyoxyethylene didodecyl ether (polyoxyethylene dilauryl ether), polyoxyethylene tetradecyl ether (polyoxyethylene myristyl ether), polyoxyethylene monotetradecyl ether (polyoxyethylene monomyristyl ether), polyoxyethylene monooleyl ether, polyoxyethylene dioleyl ether, and the like.

In one embodiment, the polishing composition according to the present aspect contains one or more selected from the group consisting of polyethylene glycol, polypropylene glycol, polyethylene alkyl ether, and polypropylene ether.

The number average molecular weight (Mn) of the nonionic surfactant (preferably, a polyoxyalkylene glycol-based compound) is preferably 100 or more, more preferably 150 or more, still more preferably 200 or more, particularly preferably 250 or more, and most preferably 300 or more. The weight average molecular weight (Mw) of the nonionic surfactant (preferably, a polyoxyalkylene glycol-based compound) may be, for example, 2000 or less, preferably less than 1000, more preferably 900 or less, still more preferably 800 or less, particularly preferably 700 or less, and most preferably 600 or less. That is, the number average molecular weight (Mn) of the nonionic surfactant (preferably the polyoxyalkylene glycol-based compound) is preferably 100 or more and less than 1000, more preferably 150 or more and 900 or less, still more preferably 200 or more and 800 or less, particularly preferably 250 or more and 700 or less, and most preferably 300 or more and 600 or less. In one embodiment, the number average molecular weight (Mn) of the nonionic surfactant (preferably, the polyoxyalkylene glycol-based compound) is 200 or more and less than 1,000. In one embodiment, the polishing inhibitor is polypropylene glycol having a number average molecular weight of 200 or more and less than 1000.

In the present specification, the number average molecular weight (Mn) of the nonionic surfactant can be measured by gel permeation chromatography (GPC) using polyethylene glycol as a standard substance. For example, measurement can be performed under the following conditions.

[Measurement of Number Average Molecular Weight (Mn) of Nonionic Surfactant]

As the number average molecular weight (Mn) of the nonionic surfactant, a value of the number average molecular weight (in terms of polyethylene glycol) measured by gel permeation chromatography (GPC) was used. The number average molecular weight was measured by the following apparatus and conditions:

GPC apparatus: manufactured by Shimadzu Corporation
Model: Prominence+ELSD detector (ELSD-LTII)
Column: VP-ODS (manufactured by Shimadzu Corporation)
Mobile phase A: Methanol
    B: 1% acetic acid aqueous solution
Flow rate: 1 mL/min
Detector: ELSD temp. 40° C., Gain 8, $N_2$ GAS 350 kPa
Oven temperature: 40° C.
Injection volume: 40 μL.

The content (concentration) of the nonionic surfactant (polyoxyalkylene glycol-based compound) in the polishing composition is not particularly limited, but is preferably 0.001 mass % or more, more preferably 0.005 mass % or more, still more preferably 0.01 mass % or more, particularly preferably 0.05 mass % or more, and most preferably 0.07 mass % or more with respect to the total mass of the polishing composition. In addition, the content of the nonionic surfactant (polyoxyalkylene glycol-based compound) in the polishing composition is preferably 10 mass % or less, more preferably 5 mass % or less, still more preferably 2 mass % or less, particularly preferably 1 mass % or less, and most preferably 0.8 mass % or less with respect to the total mass of the polishing composition. When the content of the nonionic surfactant (polyoxyalkylene glycol-based compound) is in such a range, the polishing selection ratio can be controlled in the object to be polished containing two or more different film types. According to one embodiment, when the content of the nonionic surfactant (polyoxyalkylene glycol-based compound) is in such a range, the polishing removal rate of the silicon oxide film can be further suppressed, and the polishing removal rate of the titanium nitride film is higher than the polishing removal rate of the silicon oxide film (the polishing selection ratio is higher).

That is, the content (concentration) of the nonionic surfactant (polyoxyalkylene glycol-based compound) in the polishing composition is preferably 0.001 mass % or more and 10 mass % or less, more preferably 0.005 mass % or more and 5 mass % or less, still more preferably 0.01 mass % or more and 2 mass % or less, particularly preferably 0.05 mass % or more and 1 mass % or less, and most preferably 0.07 mass % or more and 0.8 mass % or less, with respect to the total mass of the polishing composition.

The polishing composition according to the present aspect may contain a surfactant other than the nonionic surfactant (hereinafter referred to as "other surfactants"). The other surfactants may be surfactants having at least one functional group selected from a cationic group and an anionic group in the molecule. The number average molecular weight (Mn) of the other surfactants is preferably 100 or more and 1000 or less. The other surfactants may be used alone or in combination of two or more types thereof. When the polishing composition according to the present aspect contains other surfactants, the mass ratio of the nonionic surfactant to the other surfactants (nonionic surfactant: another surfactant) is preferably 80:20 to 99.99:0.01, and more preferably 90:10 to 99.9:0.1.

[Acid]

The polishing composition according to the present aspect contains an organic acid as an acid. The organic acid has a role as a pH adjusting agent. Organic acids include carboxylic acids and sulfur-containing organic acids.

Specific examples of the carboxylic acid include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, and the like. Specific examples of the sulfur-containing organic acid include methanesulfonic acid, ethanesulfonic acid, 10-camphorsulfonic acid, isethionic acid, and the like. These acids may be used alone or in combination of two or more types thereof.

The organic acid is preferably a sulfur-containing organic acid, and more preferably an organic acid having a sulfonic acid group. Therefore, as the organic acid, methanesulfonic acid, ethanesulfonic acid, 10-camphorsulfonic acid, and isethionic acid are preferable, and 10-camphorsulfonic acid is more preferable.

The content (concentration) of the organic acid in the polishing composition is not particularly limited, but is preferably 0.001 mass % or more, and more preferably 0.005 mass % or more with respect to the total mass of the polishing composition. In addition, the content of the organic acid in the polishing composition is preferably 10 mass % or less, and more preferably 5 mass % or less, with respect to the total mass of the polishing composition. When the content of the acid is in such a range, the polishing selection ratio can be controlled in the object to be polished containing two or more different film types. According to one embodiment, when the content of the acid is in such a range, the titanium nitride film can be polished at a higher polishing removal rate, and the polishing removal rate of the titanium nitride film is higher than the polishing removal rate of the silicon oxide film (the polishing selection ratio is higher).

In the polishing composition according to the present aspect, since the organic acid plays a role as a pH adjusting agent of the polishing composition, the addition amount thereof may be appropriately adjusted such that the pH of the polishing composition is, for example, 2 or more and 4 or less. As an example, when 10-camphorsulfonic acid is used, the addition amount thereof is preferably 0.005 mass % or more and 1 mass % or less, more preferably 0.008 mass % or more and 0.500 mass % or less, and particularly preferably 0.010 mass % or more and 0.100 mass % or less, with respect to the total mass of the polishing composition. In one embodiment, the content of 10 camphorsulfonic acid is 0.01 mass % or more and 0.08 mass % or less, 0.01 mass % or more and 0.06 mass % or less, 0.01 mass % or more and 0.05 mass % or less, or 0.01 mass % or more and 0.03 mass % or less with respect to the total mass of the polishing composition.

[Oxidizing Agent]

The polishing composition according to the present aspect contains an oxidizing agent. The oxidizing agent can cause an oxidation reaction with the surface of the object to be polished in the polishing process to lower the hardness of the surface and weaken the surface. By using the oxidizing agent, the polishing selection ratio can be controlled in the object to be polished containing two or more different film types. According to one embodiment, the oxidizing agent can effectively improve the polishing removal rate of an object to be polished such as a titanium nitride film, for example.

The oxidizing agent is a substance having an oxidation-reduction potential sufficient for exerting an action of oxidizing the surface of the object to be polished. For example, the oxidizing agent may be a substance having an oxidation-reduction potential higher than the oxidation-reduction potential of the object to be polished (material) at a pH at which polishing is performed. Here, the pH at which the polishing is performed is usually the same as the pH of the polishing composition. As the oxidation-reduction potential of the object to be polished (material), a value obtained by dispersing a powder of the material in water to form a slurry, adjusting the slurry to the same pH as the polishing composition, and then measuring the oxidation-reduction potential of the slurry (oxidation-reduction potential with respect to a standard hydrogen electrode at a liquid temperature of 25° C.) using a commercially available oxidation-reduction potentiometer is adopted.

In the polishing composition according to the present aspect, the oxidizing agent is hydrogen peroxide. By using the hydrogen peroxide, the polishing selection ratio can be controlled in the object to be polished containing two or more different film types. According to one embodiment, by using hydrogen peroxide, the titanium nitride film can be polished at a high polishing removal rate with respect to the polishing removal rate of the silicon oxide film.

The polishing composition according to the present aspect may contain an oxidizing agent other than hydrogen peroxide, but in order to further exert the effect of the present invention, it is preferable not to contain an oxidizing agent other than hydrogen peroxide.

The content of the oxidizing agent in the polishing composition is suitably 0.001 mol/L (1 mM) or more. From the viewpoint of controlling the polishing selection ratio in the object to be polished containing two or more different film types (for example, from the viewpoint of improving the polishing removal rate of the titanium nitride film), in some embodiments, the content of the oxidizing agent is preferably 0.005 mol/L (5 mM) or more, more preferably 0.007 mol/L (7 mM) or more, still more preferably 0.01 mol/L (10 mM) or more, particularly preferably 0.015 mol/L (15 mM) or more, and most preferably 0.03 mol/L (30 mM) or more. In addition, from the viewpoint of controlling the polishing selection ratio in the object to be polished containing two or more different film types (for example, from the viewpoint of improving the polishing selection ratio of titanium nitride/silicon oxide), the content of the oxidizing agent is appropriately set to 10 mol/L (10,000 mM) or less, preferably 5 mol/L (5000 mM) or less, more preferably 3 mol/L (3000 mM) or less (for example, 2.5 mol/L (2500 mM) or less, or 2 mol/L (2000 mM) or less), still more preferably 1 mol/L (1000 mM) or less, particularly preferably 0.5 mol/L (500 mM) or less, and most preferably 0.4 mol/L (400 mM) or less. According to one embodiment, the content of oxidizing agent is less than or equal to 0.1 mol/L (100 mM).

From the above, the content of the oxidizing agent in the polishing composition is appropriately 0.001 mol/L or more and 10 mol/L or less (1 mM or more and 10,000 mM or less), preferably 0.001 mol/L or more and 5 mol/L or less (1 mM or more and 5000 mM or less), more preferably 0.005 mol/L or more and 3 mol/L or less (5 mM or more and 3000 mM or less), still more preferably 0.007 mol/L or more and 1 mol/L or less (7 mM or more and 1000 mM or less), particularly preferably 0.01 mol/L or more and 0.5 mol/L or less (10 mM or more and 500 mM or less), and most preferably 0.02 mol/L or more and 0.4 mol/L or less (20 mM or more and 400 mM or less).

According to one embodiment, the content of the oxidizing agent in the polishing composition is 0.01 mol/L or more and 0.8 mol/L or less (10 mM or more and 800 mM or less), 0.01 mol/L or more and 0.7 mol/L or less (10 mM or more and 700 mM or less), 0.02 mol/L or more and 0.6 mol/L or less (20 mM or more and 600 mM or less), 0.03 mol/L or more and 0.5 mol/L or less (30 mM or more and 500 mM or less), or 0.05 mol/L or more and 0.5 mol/L or less (50 mM or more and 500 mM or less).

[pH]

The pH of the polishing composition of the present invention is 2 or more and 4 or less, preferably 2.0 or more and 4.0 or less, more preferably more than 2 and less than 4, still more preferably 2.2 or more and 3.8 or less, and particularly preferably 2.5 or more and 3.5 or less. When the pH is in the above range, the desired effect of the present invention is further exerted.

The pH of the polishing composition can be specifically measured by the method described in Examples.

The polishing composition of the present invention contains abrasive grains, a polishing inhibitor, an organic acid, and an oxidizing agent as essential components, but when it is difficult to obtain a desired pH only by these components, the pH may be adjusted by adding a pH adjusting agent within a range in which the effect of the present invention is not inhibited.

The pH adjusting agent may be either an alkali or an acid other than the organic acid (that is, the inorganic acid). However, in order to further exert the effect of the present invention, it is preferable that the polishing composition of an embodiment of the present invention does not contain an inorganic acid. The pH adjusting agent can be used alone or in combination of two or more types thereof.

Specific examples of the inorganic acid used as the pH adjusting agent include hydrochloric acid, sulfuric acid, nitric acid, hydrofluoric acid, boric acid, carbonic acid, hypophosphorous acid, phosphorous acid, and phosphoric acid.

Examples of the base that can be used as the pH adjusting agent include hydroxides or salts of Group 1 elements, hydroxides or salts of Group 2 elements, quaternary ammonium hydroxides or salts thereof, and the like. Examples of the salt include a carbonate, a hydrogen carbonate, a sulfate, an acetate, and the like.

The addition amount of the pH adjusting agent is not particularly limited, and may be appropriately adjusted such that the polishing composition has a desired pH.

[Dispersing Medium]

The polishing composition according to the present aspect preferably contains a dispersing medium for dispersing each component. As the dispersing medium, water; alcohols such as methanol, ethanol, and ethylene glycol; ketones such as acetone; mixtures thereof; and the like can be exemplified. Among these, water is preferable as the dispersing medium. That is, according to a preferred embodiment of the present invention, the dispersing medium contains water. According to a more preferred embodiment of the present invention, the dispersing medium is substantially composed of water. It is to be noted that the term "substantially" means that a dispersing medium other than water can be contained as long as the effect of the present invention can be achieved. More specifically, the dispersing medium preferably contains 90 mass % or more and 100 mass % or less of water and 0 mass % or more and 10 mass % or less of a dispersing medium other than water, and more preferably contains 99 mass % or more and 100 mass % or less of water and 0 mass % or more and 1 mass % or less of a dispersing medium other than water. Most preferably, the dispersing medium is water.

From the viewpoint of preventing the action of the components contained in the polishing composition from being inhibited, the dispersing medium is preferably water that does not contain impurities as much as possible. Specifically, pure water, ultrapure water, or distilled water from which impurity ions are removed with an ion exchange resin and then foreign substances are removed through a filter is more preferable.

[Electrical Conductivity]

In an embodiment of the present invention, the electrical conductivity of the polishing composition is preferably 0.05 mS/cm or more, more preferably 0.10 mS/cm or more, still more preferably 0.15 mS/cm or more, particularly preferably 0.18 mS/cm or more, and most preferably 0.20 mS/cm or more. By setting the electrical conductivity of the polishing composition to 0.05 mS/cm or more, the polishing selection ratio can be controlled in the object to be polished containing two or more different film types. According to one embodiment, by setting the electrical conductivity of the polishing composition to 0.05 mS/cm or more, the contact between the abrasive grains and the object to be polished is increased, and the effect of suppressing the polishing removal rate of silicon oxide by the polishing inhibitor can be maintained while the titanium nitride film can be polished at a higher polishing removal rate, and accordingly, the polishing selection ratio of titanium nitride/silicon oxide is improved. In an embodiment of the present invention, the electrical conductivity of the polishing composition is preferably 5.0 mS/cm or less, more preferably 2.0 mS/cm or less, still more preferably 1.0 mS/cm or less, particularly preferably 0.80 mS/cm or less, and most preferably 0.50 mS/cm or less. The electrical conductivity of the polishing composition may be 0.45 mS/cm or less or 0.40 mS/cm or less. When the electrical conductivity of the polishing composition is 5.0 mS/cm or less, the polishing selection ratio can be controlled in an object to be polished containing two or more different film types. According to one embodiment, in the present invention, when the electrical conductivity of the polishing composition is 5.0 mS/cm or less, contact between abrasive grains and the object to be polished can be sufficiently ensured, the effect of suppressing the polishing removal rate of silicon oxide by the polishing inhibitor can be maintained, and the titanium nitride film can be polished at a high polishing removal rate.

In the present invention, the method for controlling the polishing composition to a desired electrical conductivity value is also not particularly limited, but can be achieved, for example, by adding an electrical conductivity adjusting agent to the polishing composition. In the embodiment of the present invention, the electrical conductivity adjusting agent is not particularly limited as long as it can be controlled to a desired electrical conductivity value, but a salt compound is suitable.

[Other Components]

The polishing composition according to the present aspect may further contain known additives that can be used in the polishing composition, such as a complexing agent, an antiseptic agent, an antifungal agent, a water-soluble polymer, and a dissolution aid, as long as the effect of the present invention is not impaired. The polishing composition according to the present aspect is acidic. Therefore, the polishing composition more preferably contains an antifungal agent. That is, in one embodiment of the present invention, the polishing composition is substantially composed of at least one selected from the group consisting of abrasive grains, a polishing inhibitor, a dispersing medium, an organic acid and an oxidizing agent, and a pH adjusting agent, a dissolution aid, and an antifungal agent. In one embodiment of the present invention, the polishing composition is substantially composed of at least one of abrasive grains, a polishing inhibitor, a dispersing medium, an organic acid and an oxidizing agent, and a pH adjusting agent, a dissolution aid, and an antifungal agent. Here, "the polishing composition is substantially composed of at least one of abrasive grains, a polishing inhibitor, a dispersing medium, an organic acid and an oxidizing agent, and a pH adjusting agent, a dissolution aid, and an antifungal agent" means that the total content of the abrasive grains, the polishing inhibitor, the dispersing medium, the organic acid, the oxidizing agent, the pH adjusting agent, the dissolution aid, and the antifungal agent exceeds 99 mass % with respect to the polishing composition (upper limit: 100 mass %). Preferably, the polishing composition is composed of at least one of an abrasive grain, a polishing inhibitor, a dispersing medium, an organic acid, and an oxidizing agent, and a pH adjusting agent, a dissolution aid, and an antifungal agent (the total content=100 mass %).

The antifungal agent (antiseptic agent) is not particularly limited, and can be appropriately selected according to a desired application and purpose. Specific examples thereof include isothiazoline-based antiseptic agents such as 1,2-benzisothiazole-3(2H) -one(BIT), 2-methyl-4-isothiazoline-3-one, and 5-chloro-2-methyl-4-isothiazoline-3-one; phenoxyethanol; and the like.

The dissolution aid is a substance that coexists when the water-soluble polymer is dissolved in a dispersing medium (solvent) to improve the solubility of the water-soluble polymer. The polishing composition according to an embodiment of the present invention may further contain a dissolution aid.

Examples of the dissolution aid include alcohol compounds such as methanol, ethanol, 1-propanol, 2-propanol, ethylene glycol, and propylene glycol; ether compounds such as diethylene glycol diethyl ether, 2-methoxyethanol, 2-ethoxyethanol, diethylene glycol, diethylene glycol monomethyl ether, diethylene glycol monoethyl ether, diethylene glycol monobutyl ether, triethylene glycol, triethylene glycol monomethyl ether, tetraethylene glycol, dipropylene glycol, dipropylene glycol monomethyl ether, dipropylene glycol monoethyl ether, tripropylene glycol monomethyl ether, diacetone alcohol, 2-methoxyethyl acetate, 2-ethoxyethyl acetate, and diethylene glycol monoethyl ether acetate; ketone compounds such as acetone, methyl ethyl ketone, acetylacetone, and cyclohexanone; and the like. These dissolution aids can be used alone or in combination of two or more.

[Polishing Method and Method for Manufacturing Semiconductor Substrate]

The polishing composition of the present aspect is suitably used for polishing an object to be polished containing two or more different film types. According to one embodiment, the polishing composition according to the present aspect is suitably used, for example, for polishing an object to be polished containing titanium nitride and silicon oxide. Therefore, according to an embodiment of the present invention, there is provided a polishing method including polishing an object to be polished using the polishing composition according to the present aspect. In addition, according to an embodiment of the present invention, there is provided a method for manufacturing a semiconductor substrate including polishing a semiconductor substrate using the polishing composition according to the present aspect. In addition, according to an embodiment of the present invention, there is provided a method for manufacturing a semiconductor substrate, including polishing the semiconductor substrate by the polishing method according to an embodiment of the present invention.

As the polishing apparatus, it is possible to use a general polishing apparatus in which a holder for holding a substrate or the like having an object to be polished and a motor or the like capable of changing the number of revolutions are attached and which has a polishing table to which a polishing pad (polishing cloth) can be attached.

As the polishing pad, a general nonwoven fabric, polyurethane, a porous fluororesin, and the like can be used without particular limitation. The polishing pad is preferably grooved such that a polishing liquid is accumulated.

Regarding the polishing conditions, for example, the rotation speed of the polishing table and the carrier is preferably 10 rpm (0.17 s$^{-1}$) or more and 500 rpm (8.33 s$^{-1}$) or less. The pressure (polishing pressure) applied to the substrate having the object to be polished is preferably 0.5 psi (3.4 kPa) or more and 10 psi (68.9 kPa) or less.

The method for supplying the polishing composition to the polishing pad is not particularly limited, and for example, a method for continuously supplying the polishing composition by a pump or the like is adopted. This supply amount is not limited, but it is preferable that the surface of the polishing pad is always covered with the polishing composition according to the present aspect.

After completion of polishing, the substrate is washed in flowing water, and water droplets attached onto the substrate are removed by a spin dryer or the like and dried to obtain a substrate having a metal-containing layer.

The polishing composition according to the present aspect may be a one-component type or a multi-component type including a two-component type. In addition, the polishing composition according to the present aspect may be prepared by diluting a stock solution of the polishing composition, for example, three times or more (or, for example, 5 times or more) using a diluent such as water.

[Polishing Selection Ratio of Titanium Nitride/Silicon Oxide]

The polishing method according to the present aspect can polish an object to be polished containing silicon oxide and titanium nitride at a specific polishing removal rate ratio. The polishing method according to the present aspect can be preferably applied to polishing (for example, finish polishing) of an object to be polished containing silicon oxide and titanium nitride.

The lower limit of the polishing removal rate of titanium nitride is preferably more than 500 Å/min, more preferably 550 Å/min or more, still more preferably 600 Å/min or more, particularly preferably 650 Å/min or more, and most preferably 700 Å/min or more. When the polishing removal rate is more than 500 Å/min, the polishing of titanium nitride suitably proceeds. The upper limit of the polishing removal rate of the titanium nitride film is not particularly limited, but is practically 8000 Å/min or less. Note that 1 Å=0.1 nm.

The upper limit of the polishing removal rate of silicon oxide is preferably 50 Å/min or less, more preferably 40 Å/min or less, still more preferably 30 Å/min or less. When the polishing removal rate is 50 Å/min or less, the polishing selectivity of titanium nitride to silicon oxide can be further improved. The lower limit of the polishing removal rate of the silicon oxide film is not particularly limited, but is practically 5 Å/min or more.

The polishing selection ratio of titanium nitride to silicon oxide is preferably 15 or more, more preferably 17 or more, still more preferably 18 or more, and particularly preferably 20 or more. According to one embodiment, the polishing selection ratio of titanium nitride to silicon oxide is 25 or more, 30 or more, or 50 or more. The polishing selection ratio of titanium nitride/silicon oxide is calculated by dividing the polishing removal rate of silicon oxide by the polishing removal rate of the titanium nitride film.

Although the embodiments of the present invention have been described in detail, this is illustrative and exemplary and not restrictive, and it is clear that the scope of the present invention should be interpreted by the appended claims.

The present invention includes the following aspects and forms.

1. A polishing composition containing abrasive grains, an acid, a polishing inhibitor, and an oxidizing agent, in which the abrasive grains have a positive zeta potential, the acid is an organic acid, the polishing inhibitor contains a nonionic surfactant, the oxidizing agent is hydrogen peroxide, and a pH of the polishing composition is 2 or more and 4 or less.

2. The polishing composition according to the above 1., in which the polishing inhibitor is a compound having a polyoxyalkylene glycol structure.

3. The polishing composition according to the above 1. or 2., in which the abrasive grains are cationically modified silica.

4. The polishing composition according to any one of the above 1. to 3., in which the polishing inhibitor is polypropylene glycol having a number average molecular weight of 200 or more and less than 1000.

5. The polishing composition according to any one of the above 1. to 4., in which the organic acid is 10-camphorsulfonic acid.

6. The polishing composition according to any one of the above 1. to 5., in which a content of the abrasive grains is 0.01 mass % or more and 3.0 mass % or less with respect to a total mass of the polishing composition.

7. A polishing method including polishing an object to be polished using the polishing composition according to any one of the above 1. to 6.

8. A method for manufacturing a semiconductor substrate, including polishing a semiconductor substrate by the polishing method according to the above 7.

EXAMPLES

The present invention will be described in more detail with reference to the following Examples and Comparative Examples. However, the technical scope of the present invention is not limited only to the following examples. Unless otherwise specified, "%" and "part" mean "mass %" and "part by mass", respectively.

<Average Primary Particle Size of Abrasive Grains>

The average primary particle size of the abrasive grains was calculated from the specific surface area of the silica particles measured by the BET method using "Flow Sorb II 2300" manufactured by Micromeritics and the density of the abrasive grains.

<Average Secondary Particle Size of Abrasive Grains>

The average secondary particle size of the abrasive grains was measured as the volume average particle size (volume-based arithmetic average diameter; Mv) by a dynamic light scattering particle size/particle size distribution apparatus UPA-UTI151 (manufactured by Nikkiso Co., Ltd.).

<Average Association Degree of Abrasive Grains>

The average association degree of the abrasive grains was calculated by dividing the value of the average secondary particle size of the abrasive grains by the value of the average primary particle size of the abrasive grains.

<Zeta Potential of Abrasive Grains>

The zeta potential of the abrasive grains in the polishing composition was measured using a Zetasizer Nano manufactured by Malvern Panalytical Ltd., under the condition of a measurement temperature of 25° C., by the laser Doppler method (electrophoretic light scattering method), and was calculated by analyzing the obtained data using the Smoluchowski equation.

<pH of Polishing Composition>

The pH of the polishing composition was measured by using a glass electrode type hydrogen ion concentration indicator (manufactured by Horiba, Ltd., model number: F-23), performing three-point calibration using a standard buffer solution (phthalate pH buffer pH: 4.01 (25° C.), neutral phosphate pH buffer pH: 6.86 (25° C.), carbonate pH buffer pH: 10.01 (25° C.)), then placing the glass electrode in the polishing composition, and determining the pH value after the glass electrode was stabilized for 2 minutes or more.

<Electrical Conductivity of Polishing Composition>

The electrical conductivity after preparation of each polishing composition was measured with a tabletop electrical conductivity meter (manufactured by HORIBA, Ltd., model number: DS-71).

<Measurement of Number Average Molecular Weight (Mn) of Nonionic Surfactant>

As the number average molecular weight (Mn) of the nonionic surfactant, a value of the number average molecular weight (in terms of polyethylene glycol) measured by gel permeation chromatography (GPC) was used. The number average molecular weight was measured by the following apparatus and conditions:

GPC apparatus: manufactured by Shimadzu Corporation

Model: Prominence+ELSD detector (ELSD-LTII)

Column: VP-ODS (manufactured by Shimadzu Corporation)

Mobile phase A: Methanol

B: 1% acetic acid aqueous solution

Flow rate: 1 mL/min

Detector: ELSD temp. 40° C., Gain 8, $N_2$GAS 350 kPa

Oven temperature: 40° C.

Injection volume: 40 μL.

[Preparation of Polishing Composition]

Example 1

In the same manner as in the method described in Example 1 of Japanese Patent Application Laid-Open No. 2005-162533, using γ-aminopropyltriethoxysilane (APTES) as a silane coupling agent at a concentration of 0.32 mmol (0.32 mM) with respect to 1 L of an aqueous dispersion of a silica sol (silica concentration=20 mass %), cocoon-shaped cation-modified colloidal silica having an average primary particle size of 25.0 nm, an average secondary particle size of 50.0 nm, an average association degree of 2.0, and an aspect ratio of 1.2 was prepared.

As abrasive grains, the cation-modified colloidal silica obtained above was added to pure water as a dispersing medium at room temperature (25° C.) to have a final concentration of 1.8 mass %. Further, 2-methyl-4-isothiazolin-3-one (manufactured by THE DOW CHEMICAL COMPANY) was added as an antifungal agent to have a final concentration of 0.013 mM to obtain a mixed solution.

Thereafter, polypropylene glycol (Mw: 400, manufactured by Sanyo Chemical Industries, Ltd.) (in the table, it is indicated as "PPG 400") was added as a surfactant to have a final concentration of 0.1 mass %, 10-camphorsulfonic acid (in the table, "CSA" is shown) was added as an organic acid to have a pH of 3.1, the mixture was stirred and mixed at room temperature (25° C.) for 30 minutes, and a 31 mass % hydrogen peroxide aqueous solution (manufactured by SANTOKU CHEMICAL INDUSTRY CO., LTD.) was added as an oxidizing agent to have a predetermined content (mM) described in Table 1, thereby preparing a polishing composition. The pH of the obtained mixed solution was measured to be 3.1, and the electrical conductivity was 0.43 mS/cm.

The zeta potential of the cation-modified colloidal silica in the obtained polishing composition was measured according to the above method, and found to be +22.8 mV. Furthermore, the particle size of the cation-modified colloidal silica in the polishing composition was the same as the particle size of the cation-modified colloidal silica used.

Examples 2 to 9 and Comparative Examples 1 to 5

Each polishing composition was prepared in the same manner as in Example 1 except that the type of each component, the concentration thereof, and the pH were changed as shown in the following Table 1. The constitution of each polishing composition is shown in the following Table 1. The polishing compositions of Examples 4 and 5 and Comparative Example 5 had an abrasive grain concentration of 0.9 mass %. In addition, when the pH of each polishing composition was measured, the values shown in Table 1 were obtained. In Table 1 below, "PPG 1000" represents polypropylene glycol (Mw: 1000), "PEG 400" represents polyethylene glycol (Mw: 400), "PEG lauryl ether" represents polyethylene glycol lauryl ether (Mw: 400), and "-" represents that the agent was not used.

The particle size of the cation-modified colloidal silica in each of the polishing compositions of Examples 2 to 9 and Comparative Examples 1 to 5 was the same as the particle size of the cation-modified colloidal silica used.

<Evaluation of Polishing Removal Rate of Polishing Composition>

Using each polishing composition prepared above, the surface of the object to be polished was polished under the following conditions. As objects to be polished, a silicon wafer (300 mm, blanket wafer) having a titanium nitride (TiN) film having a thickness of 2500 Å formed on a surface thereof and a silicon wafer (300 mm, blanket wafer) having a TEOS type silicon oxide ($SiO_2$) film (hereinafter "TEOS film") having a thickness of 10,000 Å formed on a surface thereof were prepared.

Polishing Apparatus and Polishing Conditions)

GPC apparatus: manufactured by Shimadzu Corporation

Model: Prominence+ELSD detector (ELSD-LTII)

Column: VP-ODS (manufactured by Shimadzu Corporation)

Mobile phase A: Methanol

B: 1% acetic acid aqueous solution

Flow rate: 1 mL/min

Detector: ELSD temp. 40° C., Gain 8, $N_2$GAS 350 kPa

Oven temperature: 40° C.

Injection volume: 40 μL.

(Evaluation of Polishing Removal Rate)

The thickness of the titanium nitride film before and after polishing was obtained using a sheet resistance measuring device (VR120/08SD: manufactured by Kokusai Electric Semiconductor Service Inc.) based on a DC four-probe method. The thickness of the TEOS film before and after polishing was determined with an optical film thickness measuring instrument (ASET-f5x: manufactured by KLA-Tencor Corporation). From the obtained thickness, the polishing removal rate in each object to be polished was calculated by dividing [(thickness before polishing)−(thickness after polishing)] by the polishing time. When the polishing removal rate of the titanium nitride film exceeds 500 Å/min, the titanium nitride film can be practically used. A TEOS film of 50 Å/min or less can be practically used.

The above evaluation results are also shown in Table 1. In Tables 1 and 2, the titanium nitride film is indicated by "TiN", and the TEOS film is indicated by "SiO$_2$". In the polishing performance disclosed in Table 1, "TiN" represents the polishing removal rate of titanium nitride, "SiO$_2$" represents the polishing removal rate of silicon oxide, and "TiN/SiO$_2$" represents the polishing selection ratio of titanium nitride to silicon oxide.

What is claimed is:

1. A polishing composition for polishing an object to be polished comprising silicon oxide and titanium nitride, the polishing composition comprising abrasive grains, an acid, a polishing inhibitor, and an oxidizing agent, wherein the abrasive grains have a positive zeta potential, the acid is 10-camphorsulfonic acid, the polishing inhibitor comprises a nonionic surfactant, and the nonionic surfactant consists of a polypropylene glycol having a number average molecular weight (Mn) of 200 or more and less than 1000, the oxidizing agent is hydrogen peroxide, a pH of the polishing composition is 2 or more and 4 or less, and a selection ratio of a polishing removal rate of titanium nitride to a polishing removal rate of silicon oxide is 18 or more.

2. The polishing composition according to claim 1, wherein the abrasive grains are cationically modified silica.

3. The polishing composition according to claim 1, wherein the polishing inhibitor is polypropylene glycol having a number average molecular weight of 250 or more and less than 1000.

TABLE 1

| | Oxidizing agent | | Silicon oxide Polishing inhibitor | | pH adjusting agent | | Physical properties | | Polishing performance | | |
|---|---|---|---|---|---|---|---|---|---|---|---|
| | | | | | | | | | Polishing removal rate of | Polishing removal rate of | |
| | Compound | Concentration [mM] | Compound | Concentration [mass %] | Compound | Concentration [mass %] | pH [—] | EC [mS/cm] | SiO$_2$ [Å/min] | TiN [Å/min] | TiN/ SiO$_2$ |
| Example 1 | H$_2$O$_2$ | 27 | PPG400 | 0.1 | CSA | 0.045 | 3.1 | 0.43 | 35 | 713 | 20.37 |
| Example 2 | H$_2$O$_2$ | 27 | PPG400 | 0.2 | CSA | 0.045 | 3.1 | 0.43 | 34 | 724 | 21.29 |
| Example 3 | H$_2$O$_2$ | 27 | PPG400 | 0.5 | CSA | 0.045 | 3.1 | 0.43 | 33 | 701 | 21.25 |
| Example 4 | H$_2$O$_2$ | 27 | PPG1000 | 0.1 | CSA | 0.045 | 3.1 | 0.42 | 45 | 699 | 15.53 |
| Example 5 | H$_2$O$_2$ | 365 | PPG400 | 0.1 | CSA | 0.045 | 3.1 | 0.43 | 35 | 2130 | 60.86 |
| Example 6 | H$_2$O$_2$ | 365 | PPG400 | 0.1 | CSA | 0.023 | 3.4 | 0.21 | 29 | 2073 | 71.48 |
| Example 7 | H$_2$O$_2$ | 27 | PPG400 | 0.1 | CSA | 0.023 | 3.4 | 0.21 | 30 | 732 | 24.40 |
| Example 8 | H$_2$O$_2$ | 27 | PEG400 | 0.1 | CSA | 0.045 | 3.1 | 0.42 | 42 | 733 | 17.45 |
| Example 9 | H$_2$O$_2$ | 27 | PEG lauryl ether | 0.1 | CSA | 0.045 | 3.1 | 0.40 | 47 | 746 | 15.87 |
| Comparative Example 1 | — | — | — | — | CSA | 0.045 | 3.1 | 0.42 | 81 | 75 | 0.93 |
| Comparative Example 2 | H$_2$O$_2$ | 27 | — | — | CSA | 0.045 | 3.1 | 0.42 | 83 | 728 | 8.77 |
| Comparative Example 3 | H$_2$O$_2$ | 27 | PPG400 | 0.1 | Nitric acid | 0.013 | 3.1 | 0.56 | 55 | 671 | 12.20 |
| Comparative Example 4 | H$_2$O$_2$ | 27 | PPG400 | 0.3 | Nitric acid | 0.013 | 3.1 | 0.53 | 50 | 623 | 12.46 |
| Comparative Example 5 | H$_2$O$_2$ | 27 | — | — | CSA | 0.023 | 3.4 | 0.21 | 63 | 721 | 11.44 |

As is apparent from Table 1 above, it was found that when the polishing composition of Example was used, the polishing removal rate of the silicon oxide (SiO$_2$) film was suppressed while the titanium nitride (TiN) film was polished at a high polishing removal rate, and a high polishing selection ratio was shown. On the other hand, in the polishing compositions of Comparative Examples, the polishing removal rate of the silicon oxide film tended to increase.

Therefore, it can be seen that the polishing composition according to the present aspect can polish the titanium nitride film at a high polishing removal rate with respect to the polishing removal rate of the silicon oxide film.

The present application is based on Japanese Patent Application No. 2023-169675 filed on Sep. 29, 2023, the disclosure content of which is incorporated herein by reference in its entirety.

4. The polishing composition according to claim 1, wherein a content of the abrasive grains is 0.01 mass % or more and 3.0 mass % or less with respect to a total mass of the polishing composition.

5. A polishing method comprising polishing an object to be polished using the polishing composition according to claim 1.

6. A method for manufacturing a semiconductor substrate, comprising polishing a semiconductor substrate by the polishing method according to claim 5.

7. The polishing composition according to claim 1, wherein the content of hydrogen peroxide is 0.01 mol/L or more and 0.5 mol/L or less.

8. The polishing composition according to claim 1, wherein the content of hydrogen peroxide is 0.03 mol/L or more and 0.5 mol/L or less.

9. The polishing composition according to claim 1, wherein the number average molecular weight (Mn) of the polypropylene glycol is 250 or more and 900 or less.

10. The polishing composition according to claim 1, wherein the number average molecular weight (Mn) of the polypropylene glycol is 250 or more and 800 or less.

11. The polishing composition according to claim 1, wherein the number average molecular weight (Mn) of the polypropylene glycol is 250 or more and 700 or less.

12. The polishing composition according to claim 1, wherein the number average molecular weight (Mn) of the polypropylene glycol is 250 or more and 600 or less.

13. The polishing composition according to claim 1, wherein an electrical conductivity is 0.20 mS/cm or more and 0.80 mS/cm or less.

14. A polishing composition for polishing an object to be polished comprising silicon oxide and titanium nitride, consisting of abrasive grains, an acid, a polishing inhibitor, an oxidizing agent, a dispersing medium and optionally an additive, wherein the abrasive grains have a positive zeta potential, the acid is 10-camphorsulfonic acid, the polishing inhibitor comprises a nonionic surfactant, and the nonionic surfactant consists of a polypropylene glycol having a number average molecular weight (Mn) of 200 or more and less than 1000, the oxidizing agent is hydrogen peroxide, the additive is one or more selected from the group consisting of a complexing agent, an antiseptic agent, an antifungal agent, a water-soluble polymer, and a dissolution aid, a pH of the polishing composition is 2 or more and 4 or less, and a selection ratio of a polishing removal rate of titanium nitride to a polishing removal rate of silicon oxide is 18 or more.

15. A polishing composition for polishing an object to be polished comprising silicon oxide and titanium nitride, the polishing composition comprising abrasive grains, an acid, a polishing inhibitor, and an oxidizing agent, and not comprising a polyethylene glycol, wherein:

the abrasive grains have a positive zeta potential, the acid is 10-camphorsulfonic acid, the polishing inhibitor comprises a nonionic surfactant, and the nonionic surfactant contains a polypropylene glycol having a number average molecular weight (Mn) of 200 or more and less than 1000, the oxidizing agent is hydrogen peroxide, and a content of the hydrogen peroxide is 0.01 mol/L or more and 0.5 mol/L or less, a pH of the polishing composition is 2 or more and 4 or less, and a selection ratio of a polishing removal rate of titanium nitride to a polishing removal rate of silicon oxide is 18 or more.

\* \* \* \* \*